United States Patent [19]

Chigusa et al.

[11] Patent Number: 5,099,906
[45] Date of Patent: Mar. 31, 1992

[54] ROLLER SCREEN UNIT

[75] Inventors: Tomomichi Chigusa; Osamu Tsuchida, both of Tokyo, Japan

[73] Assignee: Metaco Co., Ltd., Tokyo, Japan

[21] Appl. No.: 556,504

[22] Filed: Jul. 24, 1990

[30] Foreign Application Priority Data

Sep. 19, 1989 [JP] Japan .................................. 1-109217
Sep. 20, 1989 [JP] Japan .................................. 1-244394
Oct. 27, 1989 [JP] Japan .................................. 1-126326

[51] Int. Cl.$^5$ .............................................. E06B 9/56
[52] U.S. Cl. .................................... 160/297; 160/305; 160/392
[58] Field of Search .............. 160/297, 300, 296, 291, 160/321, 293.1, 294, 392, 395, 66, 67

[56] References Cited

U.S. PATENT DOCUMENTS

| | | | |
|---|---|---|---|
| 350,656 | 10/1886 | Brooks | 160/293.1 |
| 1,898,686 | 2/1933 | Rice | 160/392 X |
| 2,547,692 | 4/1951 | D'Azzo | 160/392 X |
| 2,758,526 | 8/1956 | McFadden | 160/294 X |
| 4,250,942 | 2/1981 | Dreher et al. | 160/297 |
| 4,305,447 | 12/1981 | Persson | 160/297 |
| 4,345,636 | 8/1982 | Fukuchi | 160/297 |
| 4,466,475 | 8/1984 | Saito et al. | 160/297 |
| 4,681,279 | 7/1987 | Nakamura | 160/294 X |

Primary Examiner—David M. Purol
Attorney, Agent, or Firm—Armstrong, Nikaido, Marmelstein, Kubovcik, & Murray

[57] ABSTRACT

In the roller screen unit of the present invention, a clutch mechanism based on centrifugal effect using balls is provided with a ratchet member in which a cylindrical portion having notches between engaging grooves of a stator member and floating grooves of a rotator member, to perform stepwise operations of drawing/expanding, winding/housing and stopping the screen member. The roller screen unit of the present invention is provided with a braking mechanism having a top member, for controlling rotation of the rotator member during winding/housing of the screen member, centrifugally in contact with the inner peripheral surface of the rotator member. In addition, a connecting portion having side edge turnups or beads portion is provided at an end of the screen member and are engaged with groove provided in the longitudinal direction of the roller sleeve to simplify and facilitate to attach the screen member to the roller sleeve.

11 Claims, 8 Drawing Sheets

ROLLER SCREEN UNIT

FIELD OF THE INVENTION

The present invention relates to a roller screen unit, more particularly, to a roller screen unit which, in an automatic winding type roller screen unit using the torsion power of a spiral spring, has a clutch mechanism permitting easy operations of drawing/expanding and winding/housing of a screen member and ensuring changeover between these operations, a braking mechanism capable of improving braking function upon winding/housing of the screen member with an excellent accuracy of stop positioning, and an attachment structure of the screen member onto a roller sleeve permitting easy attachment of the screen member to the roller sleeve without any limitation in thickness of the screen member.

DESCRIPTION OF PRIOR ART

An automatic winding type roller screen unit using the torsion power of a spiral spring built in a roller sleeve, of which imparting/accumulating and releasing/restoring permit drawing/expanding and winding/housing of a screen member such as a curtain, a blind, a light-weight shutter or a projection screen from the roller sleeve has conventionally been known.

In these conventional roller screen units, an end of the spiral spring is fixed to the interior of the roller sleeve attached with the screen member, and the other end thereof is connected to a pillow member rotatable with the roller sleeve, so that the spiral spring is caused to accumulate its torsion power when drawing and expanding the screen member, and the screen member is rolled up onto the roller sleeve by releasing the torsion power of the spiral spring. It is also possible in these roller screen units to stop the roller sleeve at a voluntary position.

Drawing/expanding and winding/housing of the screen member and stoppage thereof at an adequate position are achieved by a clutch mechanism provided on the roller screen unit.

The clutch mechanisms conventionally known include, for example, the ratchet-type one in which the clutch is released by the centrifugal effect resulting from rotation movement during drawing and winding of the screen member, whereas during stoppage, an engaging pawl supported by a rotator member is engaged with the gear portion provided on a stator member rotatably engaging with the rotator member so as to cause downward falling under gravity, and the ball-type one in which a power roller or a power ball charged so as to come between inner and outer circumferences of a stator member and a rotator member engaging therewith is centrifugally released during drawing and winding of the screen member and is bitten between the stator member and the rotator member through free falling during stoppage.

However, the above-mentioned clutch mechanisms using centrifugal effect are defective in that operations such as drawing/expanding, winding/housing and stopping of the screen member and re-drawing/re-expanding thereof after stoppage must be changed through subtle touch and timing of human operation. Depending upon the manual operation, therefore, the screen member sometimes fails to stop at a prescribed position and the screen member may suddenly be rolled up onto the roller sleeve, and these operational errors are inevitable in these types of conventional clutch mechanisms. For the purpose of solving these defects, a type simply changing over between ON and OFF such as a mechanical clutch mechanism is conceived, but this type requires frequent changeover between ON and OFF, thus resulting in very troublesome operations.

Meanwhile, the screen member is suddenly rolled up onto the roller sleeve, in a roller screen unit, during winding and housing of the screen member onto the roller sleeve. To avoid this inconvenience, braking means having various built-in reducing mechanisms have been employed to alleviate the winding speed of the screen member.

As such braking means, for example, the acceleration type centrifugal brake based on friction with the inner peripheral surface of a fixed drum and the oil dumper type braking means have been known.

However, the acceleration type centrifugal brake has such problems as the limitation in size of the braking member and noise upon braking. The oil dumper type braking means is defective in that a change in atmosphere temperature causes a change in viscosity of the braking fluid, and this in turn causes a change in the braking performance.

In the conventional roller screen unit, furthermore, one of the technical problems to be solved is how to attach the screen member to the roller sleeve.

It has been known as conventional practices, for example, to provide notches and projections of the roller sleeve, to form grooves on a supporting piece secured to the screen member, to insert the side edges of the supporting piece into the notches of the roller sleeve, and to engage the projections of the roller sleeve with the grooves on the supporting piece: this is one of the known attachment structures of the screen member to the roller sleeve, and a more simple attachment structure is known, which comprises inserting the supporting piece secured with the screen member into the notch provided on the roller sleeve.

However, because the end of the screen member is also inserted into the notch on the roller sleeve, there is available only a very limited freedom for the thickness of the screen member. Kinds and thickness of the screen member capable of being attached have largely been restricted by the size of the notch formed on the roller sleeve. This restriction makes the attaching operation of the screen member to the roller sleeve troublesome, and the screen member would have unsteadiness for a thickness of the screen member outside a certain range, thus leading to a damage to the screen member.

SUMMARY OF THE INVENTION

An object of the present invention is to provide a roller screen unit having a new clutch mechanism which permits easy operations of drawing/expanding and winding/housing of the screen member and changeover between these operations.

Another object of the present invention is to provide a roller screen unit having a new braking mechanism, in a compact constitution, capable of improving braking action in winding/housing of the screen member and accuracy of positioning.

A further another object of the present invention is to provide a roller screen unit having a new attachment structure of the screen member to the roller sleeve, which permits easy attachment of the screen member, and in addition, requires no restriction by kinds and thickness of the screen member.

Other objects and advantages of the present invention will be more fully described with reference to the accompanying drawings illustrative of preferred embodiments of the present invention.

BRIEF DESCRIPTION OF THE DRAWINGS

FIGS. 2(a), (b) and (c), 3(a), (b) and (c), and 4(a), (b) and (c) are respectively partially cutaway left side views, partially cutaway front view and partially cutaway right side views illustrating operations of the clutch mechanism in the roller screen unit of the present invention;

FIGS. 5(a) and (b), and 6(a) and (b) are respectively partially cutaway left side view and partially cutaway right side views illustrating operations of the clutch mechanism in the roller screen unit of the present invention;

DETAILED DESCRIPTION OF THE PREFERRED EMBODIMENTS INVENTION

Now, the roller screen unit of the present invention is more fully described by means of embodiments with reference to the drawings.

Figure 1:
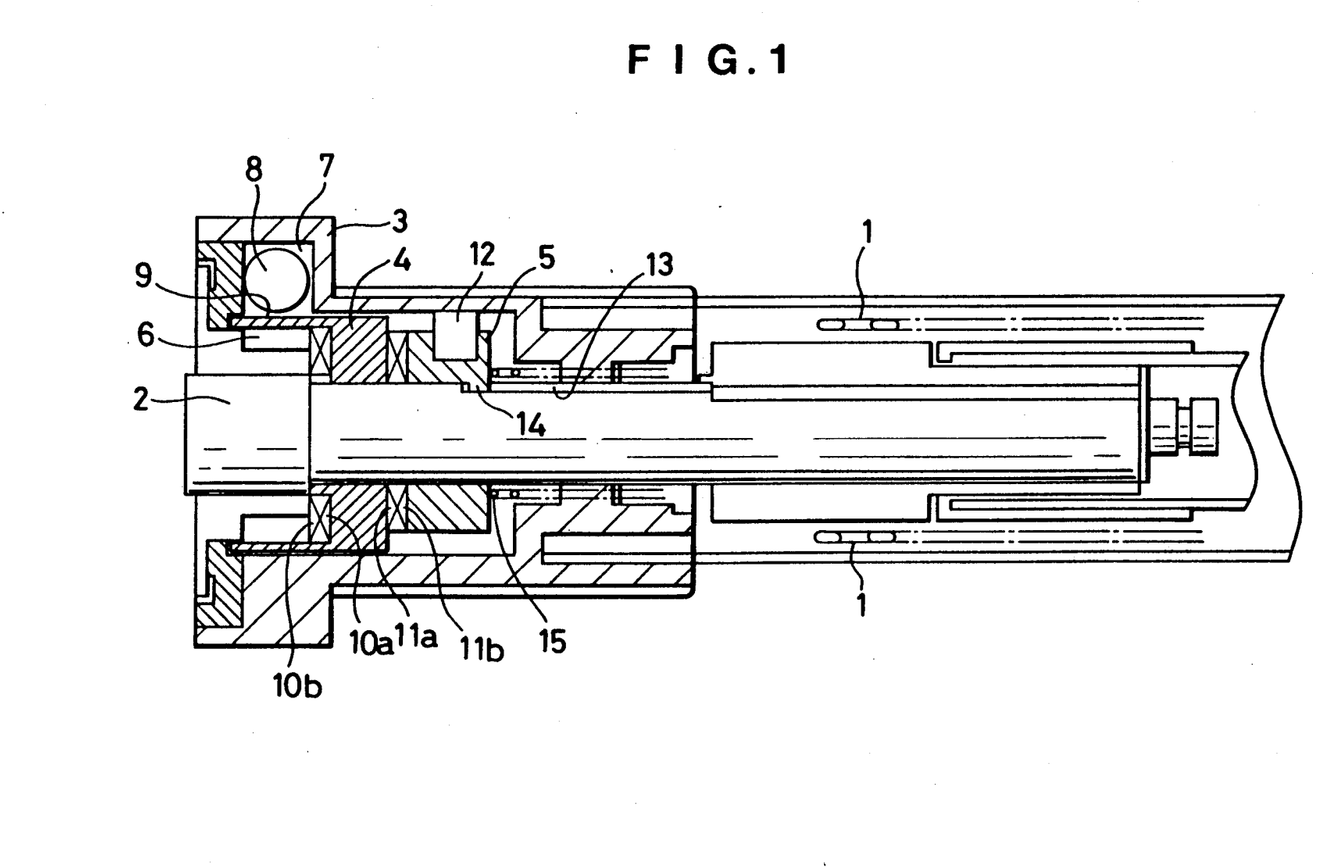
FIG. 1 is a partially cutaway sectional view illustrating an embodiment of the clutch mechanism in the roller screen unit of the present invention.

As shown in FIG. 1, the roller screen unit of the present invention accomplishes drawing/expanding and winding/housing of various screen members, by using the torsion power of a spiral spring (1) built in, through imparting/accumulating and releasing/restoring thereof.

A rotator member (3), a ratchet member (4) and a rotating member (5) are rotatably engaged with the outer periphery of a fixed stator member (2). However, the angle of rotation of the rotating member (5) is limited within a certain range as described later.

Plural, for example four, engaging grooves (6) are provided at prescribed positions on the outer peripheral surface of the stator member (2), and floating grooves (7) are provided on the inner peripheral surface of the rotator member (3). Balls (8) are floatably engaged with these floating grooves (7). The engaging grooves (6) and the floating grooves (7) are intermittently conformed through notches formed on a cylindrical portion (9) provided on the extension at an end of the ratchet member (4). When the engaging grooves (6) conform with the floating grooves or recesses (7), the balls (8) are engaged by the engaging grooves (6), the notches and the floating grooves (7) to prevent rotation of the rotator member (3). In the state shown in FIG. 1, the balls (8) are not engaged.

Engagement portions (10a) and (11a) engaging only in a single direction are formed at both ends of the ratchet member (4), and other engagement portions (10b) and (11b) are formed at an end of the stator member (2) and at an end of the rotating member (5) opposing engagement portions (10a) and (11a). Each of the engagement portions (10a), (10b), (11a) and (11b) may appropriately be based on various manners of surface engagement, 1 for example engagement of pawls on the inner and outer peripheral surfaces.

The rotating member (5) has a friction piece (12) in contact with the inner wall of the rotator member (3) on the outer peripheral surface thereof, and has, on the inner peripheral surface thereof, projection (14) movably engaging with an actuating a groove (13) other than the engaging grooves (6) of the stator member (2). This rotating member (5) is pressed by the torsion power of the spring (15) against the ratchet member (4). The rotating member (5) changes the rotating direction intermittently along with rotation and stoppage of the rotator member (3) to control changeover between drawing/expanding and winding/housing of the screen member by balls (8).

Figure 2:
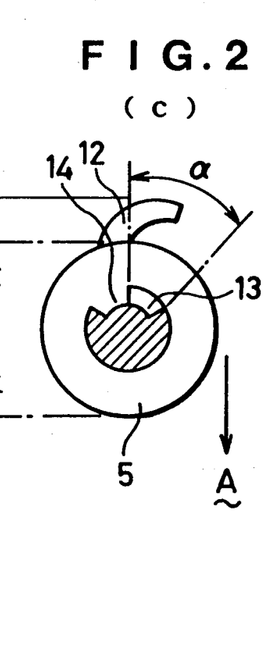

The clutch mechanism as described above works as follows:

FIG. 2 illustrates the stop state of the rotator member (3).

The engaging grooves (6) of the stator member (2) conform with notches (16) of the cylindrical portion (9) of the ratchet member (4). Any adjacent engaging groove (6) and a notch (16) in conformation has a relationship of forming an angle of 90° from the center of each other. There is a phase difference of 45° between an engaging groove (6) and a cylindrical portion (9). The balls (8) freely fall down due to the conformation between the engaging grooves (6), the notches (16) and the floating grooves (7) of the rotator member (3), and are engaged by these engaging grooves (6), the notches (16) and the floating grooves (7). In this state, the projection (14) on the inner peripheral surface of the rotating member (5) is at the stop position as shown in FIG. 2 (c) relative to the groove (13) of the stator member (2). The angle α is, for example in this case, about 45°.

The screen member is drawn and expanded from this state, and the rotator member (3) is caused to rotate in direction A.

Figure 3A:
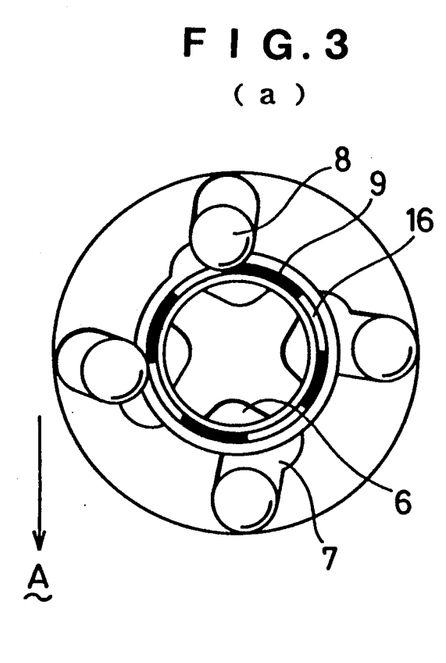
Figure 3B:
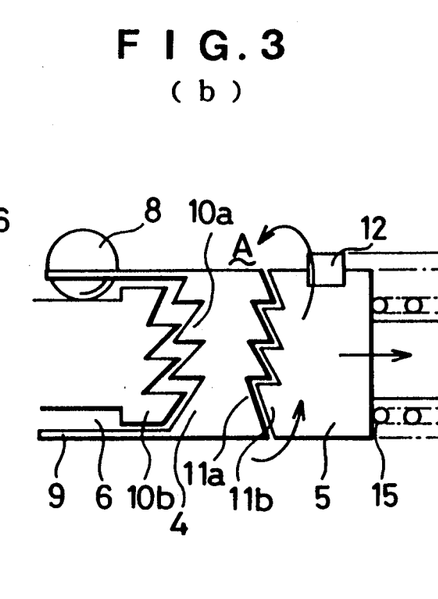
Figure 3C:
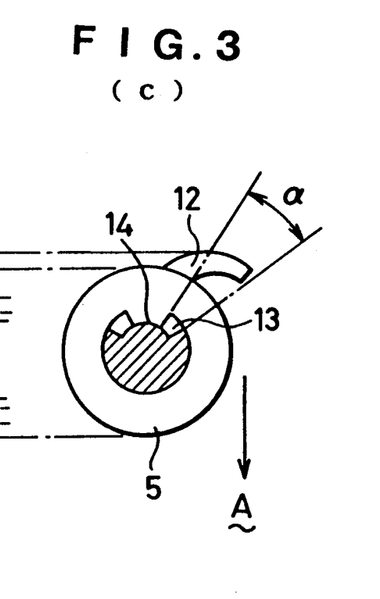

Rotation of the rotator member (3) is transmitted through the friction piece (12) to the rotating member (5), resulting in rotation of the rotating member (5). The engagement portion (11a) of the ratchet member (4) engages with the engagement portion (11b) of the rotating member (5), and the ratchet member (4) turns with the rotation of the rotating member (5). As the engagement portion (10a) of the ratchet member (4) comes off, the engagement portion (10b) of the stator member (2) slips on the latter engagement portion (10b). The cylindrical portion (9) also moves along with rotation of the ratchet member (4). This movement is shown in FIG. 3 on the assumption of an angle α of approximately 25°. At this moment, engagement of the balls (8) is released.

Figure 4A:
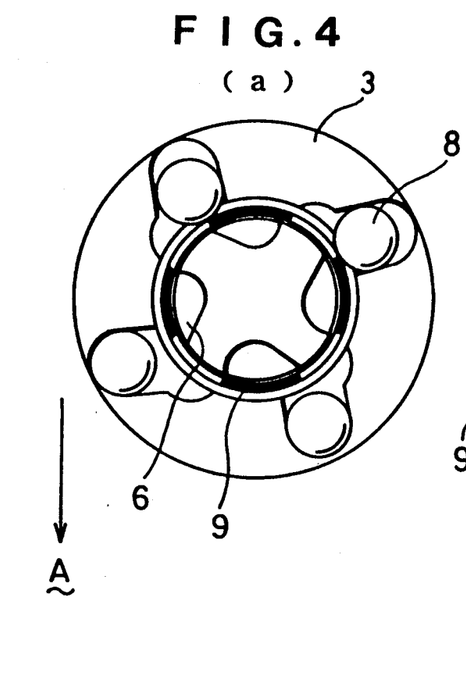
Figure 4B:
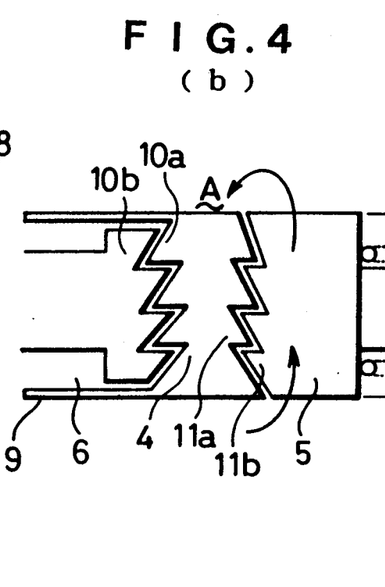
Figure 4C:
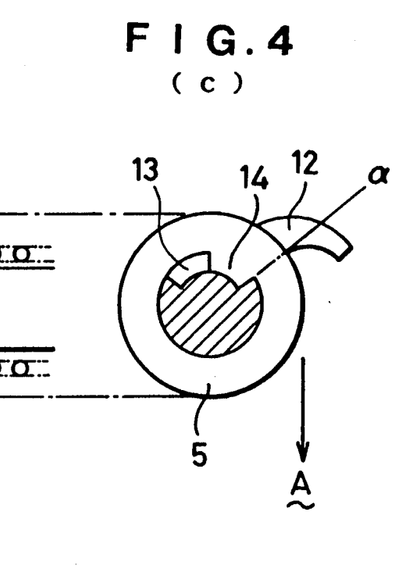

When rotation is continued by about 45° from the state shown in FIG. 2 to an angle α of 0°, the state shown in FIG. 4 is achieved. In this state, the movement of the cylindrical portion (9) by about 45° causes the cylindrical portion (9) to fully block the engaging grooves (6). As is clear from FIG. 4 (c) movement of the projection (14) is prevented by the groove (13) irrespective of rotation of the rotator member (3) in direction A, and thus the rotating member (5) does not rotate. In this state, rotation of the rotator member (3) does not result in engagement of the balls (8) into the engaging grooves (6). The rotator member (3) rotates while slipping on the friction piece (12). The screen member can be drawn and expanded by rotation of the rotator member (3).

Figure 5:
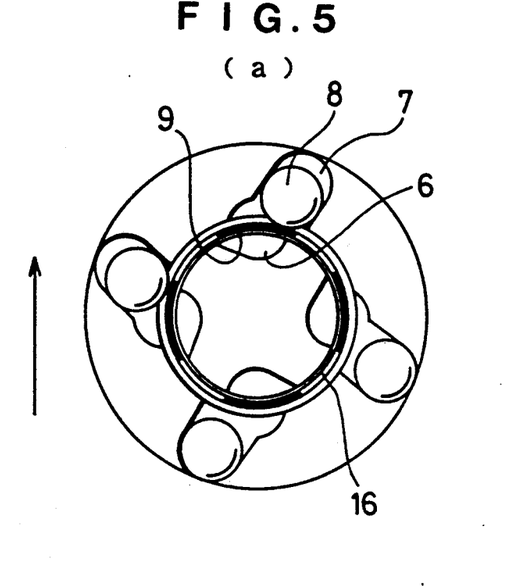

Then, when manual drawing/expanding of the screen member is discontinued, winding/housing of the screen member is started in a direction opposite to direction A as described above under the effect of the torsion power of the spiral spring (1). Frictional force between the friction piece (12) and the rotator member (3) causes the rotating member (5) to rotate and move in with an angle α of about 45° of the projection (14). More particularly, the position as shown in FIG. 5 is achieved. In this position, the engagement portions (11a) and (11b) of the ratchet member (4) and the rotating member (5) do not engage with each other, but the rotating member (5) rotates while slipping on the ratchet member (4). The engagement portion (10a) of the ratchet member (4) is in engagement with the engagement portion (10b) of the stator member (2). The rotator member (3) rotates further while slipping on the friction piece (12), and thus winding/housing of the screen member is accomplished.

Figure 6:
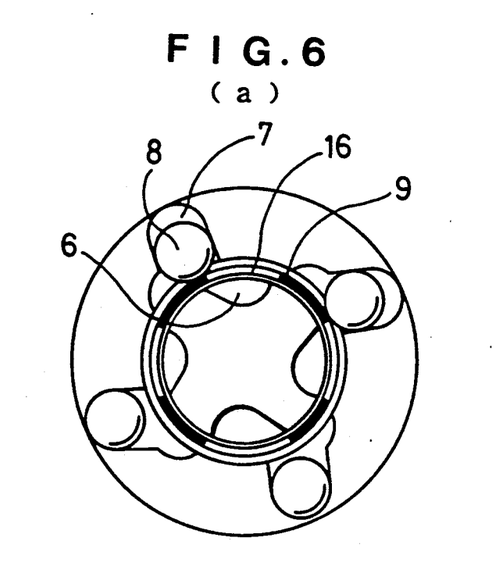

In order to stop the screen member at a prescribed position, this winding is discontinued and the screen member is slightly drawn and expanded again in direction A. Then, the engagement portion (10a) of the ratchet member (4) comes off the engagement portion (10b) of the stator member (2), and at the same time, the other engagement portion (11a) engages with the engagement portion (11b) of the rotating member (5). Frictional force between the rotator member (3) and the friction piece (12) causes rotation of the rotating member (5) through rotation of the rotator member (3) until the state with an angle α of 0° is reached, while the ratchet member (4) also rotates. When the state with an angle α of 0° is achieved, the cylindrical portion (9) of the ratchet member (4) moves by 45° from the position shown in FIG. 5, and thus the engaging grooves (6) conform with the notches (16). This position is illustrated in FIG. 6. When manual operation of drawing/expanding of the screen member is discontinued in this state, the rotator member (3) and the rotating member (5) rotate in an opposite direction under the effect of the torsion power of the spiral spring (1) and achieve again the state with an angle α of about 45° as shown in FIG. 2. In this position, the balls (8) are engaged by the engaging grooves (6), the notches (16) and the floating grooves (7) to stop the rotator member (3). While the rotating member (5) rotates by about 45°, the engagement portion (11b) of the rotating member (5) slips on the engagement portion (11a) of the ratchet member (4), thus never causing the ratchet member (4) to rotate. As a result, the cylindrical portion (9) of the ratchet member (4) keeps the position shown in FIG. 6 to allow engagement of the balls (8) into the engaging grooves (6).

In the case of the clutch mechanism in the roller screen unit of the present invention, as described above, drawing/expanding of the screen member and stoppage thereof at a prescribed position are accomplished, from the state of stoppage (FIG. 2), in accordance with a cycle consisting of:

[I] drawing of the screen member (FIG. 3),

[II] release of drawing, spontaneous rewinding (FIG. 4) (FIG. 5),

[III] drawing of the screen member (FIG. 6), and

[IV] release of drawing, stoppage (FIG. 2).

This cycle, being mechanically stepwise, is easy to operate. A clutch mechanism based on centrifugal effect and mechanical ratchet mechanism is achieved. The present invention thus provides a roller screen unit easy to use, which permits simple operations without depending upon human touch and timing as in the conventional operations.

Figure 7:
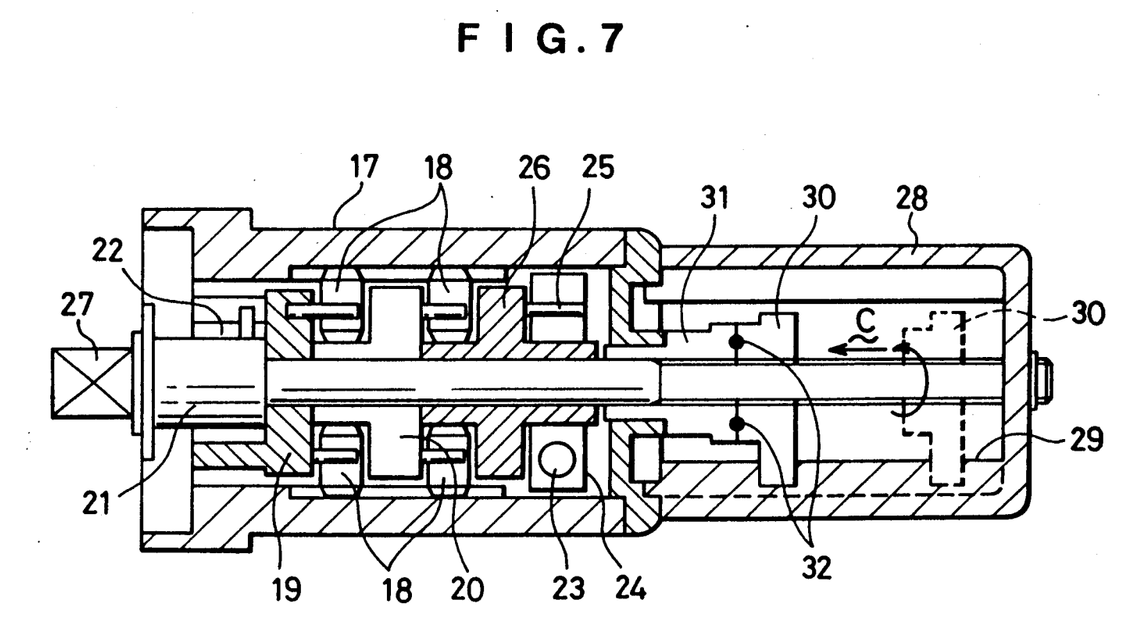
FIG. 7 is a partially cutaway sectional view illustrating an embodiment of the braking mechanism in the roller screen unit of the present invention, together with an embodiment of the stop mechanism for stopping the rotation of the rotator member.

As shown in FIG. 7 the roller screen unit of the present invention has a braking mechanism.

The braking mechanism has a retainer (19) and a sun gear (20) as rotating members having planetary pinion gears (18) rotated by rotation of a rotator member (17) other than the above-mentioned one, through the gear portion of the inner peripheral surface of rotator member (17), which rotates in contact with the inner surface of the roller sleeve. A particular combination of the group of planetary pinion gears and the sun gear makes available a large braking force with a small torque. The sun gear (20) may have a plural constitution to implement a larger braking force with a smaller torque.

A clutch mechanism (22) other than that described above is provided between the retainer (19) and another stator member (21) other than the above-mentioned one for positive/negative rotation adjustment. As this clutch mechanism (22), any of various structures including the ball clutch mechanism may be adopted.

A rotating member (26) other than that described above comprising a top member (24) supported with a pin (25) mounted with a weight balancing member (23) which controls rotation of the rotator member (17) by means of frictional force resulting from the centrifugal contact with the inner peripheral surface of the rotator member (17) through rotation of the planetary pinion gear (18) of the sun gear (20) which is rotatably supported by the stator member (21). The stator member (21), being secured by a rectangular pin (27), never rotates.

In the braking mechanism as described above, the rotator member (17) is braked from the inside thereof by means of the frictional force caused by the centrifugal effect of the top member (24), for the purpose of braking the rotational acceleration of high-speed rotation of the rotator member (17) when the screen member is rolled up upon releasing of the torsion power of the spiral spring (1) shown in FIG. 1, for example.

Rotation of the rotator member (17) is transmitted through the planetary pinion gear (18) and the rotating member (26) to the top member (24). Then, the top member (24) is directed outside with the pin (25) as the center. The centrifugal force at this moment is increased by the presence of the weight balancing member (23) such as a ball member, thus increasing the frictional force with the inner peripheral surface of the rotator member (17).

Figure 8:
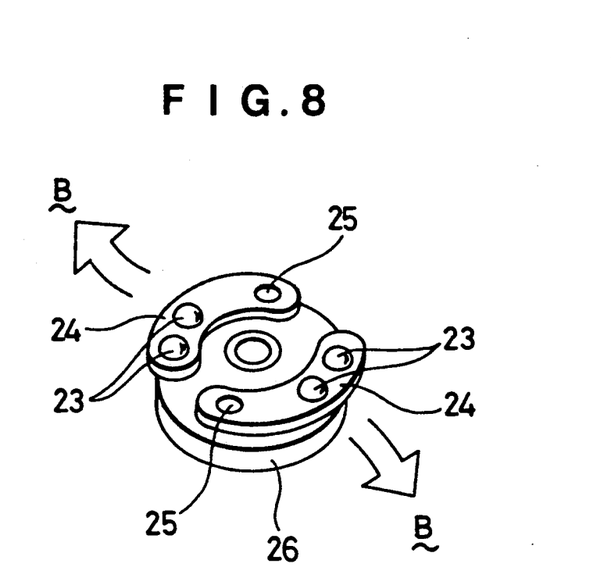
FIG. 8 is a perspective view illustrating the top member in the braking mechanism shown in FIG. 7.

An embodiment of the top member (24) and the rotating member (26) is illustrated in FIG. 8.

In this embodiment, the top member (24) is each provided with two ball-type weight balancing members (23). The top member (24) expands in direction B around the pin (25), and presses the rotator member (17), in contact with the inner peripheral surface thereof.

The braking mechanism shown in FIG. 7 is provided with a stop mechanism for stopping rotation of the rotator member (17).

The stop mechanism is achieved by the horizontal movement in direction C of a boss member (30) which rotates by means of an engaging portion (29) provided on the inner surface of a spline (28) that rotates with rotation of the rotator member (17). This boss member (30) moves through the gear portion of the shaft of the fixed stator member (21). Under the effect of the spline (28) rotating upon rolling up the screen member, the boss member (30) moves in direction C, and comes into contact with the fixed portion (31) of the stator member (21), particularly with the end face thereof provided with an O-ring (32). In this state, the boss member (30) can no longer be moved. A braking force, therefore, acts on the rotator member (17) so as to stop rotation thereof. The O-ring (32) plays a role of a shock absorber in this case.

In the braking mechanism of the roller screen unit, for example, in the embodiment as described above, the braking force can easily be controlled through adjustment of the weight balancing member (23) provided on the top member (24), and it is possible to appropriately change the design and manufacture thereof in response to the scale and performance of the roller screen unit. The boss member (30) may have a smaller pitch and/or a smaller-diameter to achieve a more compact size of the unit.

By using the clutch mechanism previously described together with this braking mechanism, there is provided a new roller screen unit excellent in operational convenience, which permits simple and easy operations of drawing/expanding and winding/housing of the screen member and changeover between these operations, and allows accurate stoppage of the screen member. The clutch mechanism and the braking mechanism may, for example, be provided respectively at both ends of the roller sleeve. It is needless to mention that there is no restriction in the manner of providing these mechanisms.

In addition, the roller screen unit of the present invention has an attachment structure of the screen member to the roller sleeve as described below.

Figure 9:
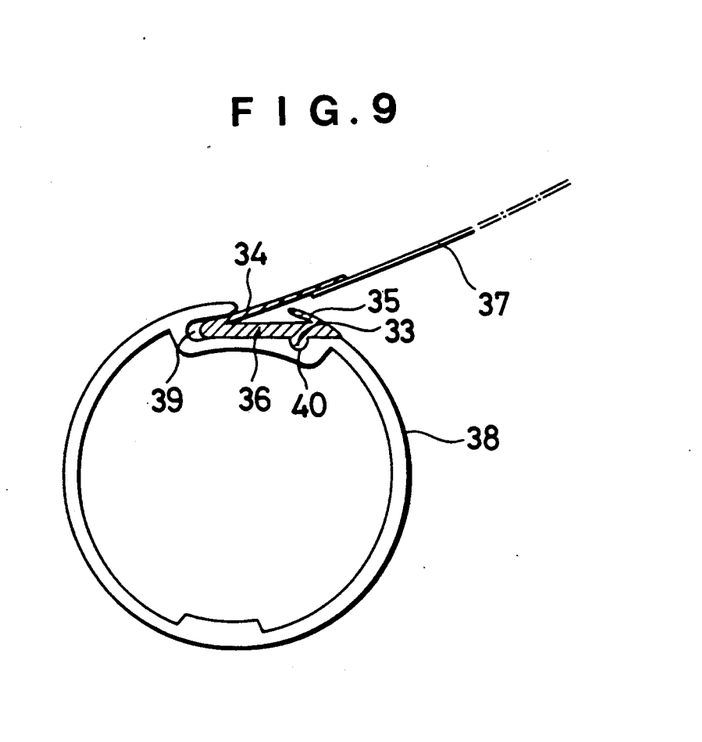
FIG. 9 is a sectional view illustrating an embodiment of the attachment structure of the screen member to the roller sleeve in the roller screen unit of the present invention.

As shown in FIG. 9, for example, in a hard sheet member (36) having a projection (33) and side edge turnups (34) (35), a screen member (37) is secured to one of the side edge turnups (34), and the other side edge turnup (35) forms a curved surface identical with the outer peripheral surface of the roller sleeve (38).

The hard sheet member (36) may be made, for example, of hard vinyl chloride resin.

The side edge turnup (34) securing the screen member (37) may, on the other hand, be made of soft vinyl chloride resin. Securing the screen member (37) may be accomplished through fastening with an adhesive or a adhesive double coated tape, or through thermal fastening or sewing.

Attachment of the hard sheet member (36) securing the screen member (37) to the roller sleeve (38) is accomplished through insertion of the leading ends of the side edge turnup (34) and the hard sheet member (36) into a notch (39) formed on the roller sleeve (38) and engagement of the projection (33) of the hard sheet member (36) with a groove (40) provided on the roller sleeve (38). This allows for a simpler attachment operation with a single touch. Furthermore, since this attachment structure of the screen member (37) to the roller sleeve (38) does not require insertion of the screen member (37) into the notch (39), attachment of the screen member (37) is never restricted by the thickness thereof. So far as the thickness of the leading ends of the hard sheet member (36) and the side edge turnup (34) corresponds to the size of the notch (39), the screen member (37) of any thickness may be attached to the roller sleeve (38).

Figure 10:
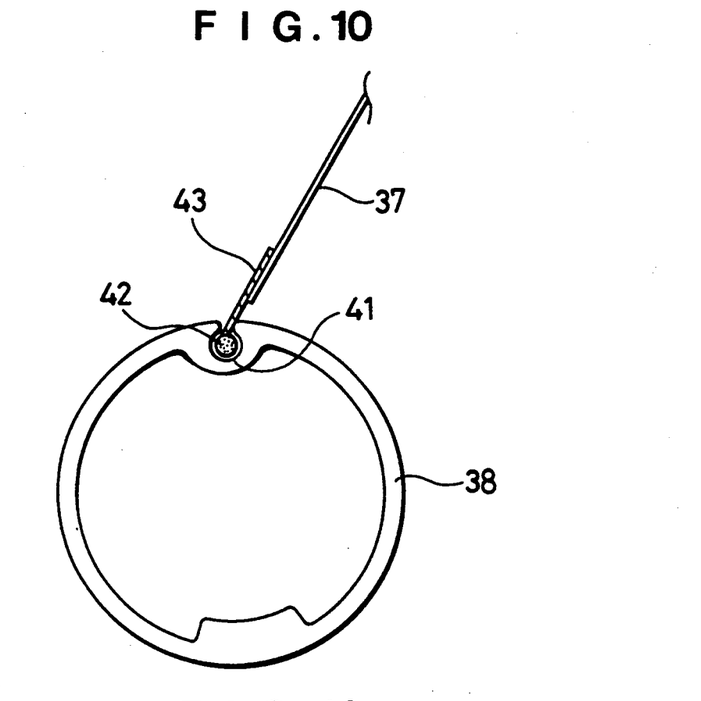
FIGS. 10 and 11 are respectively a sectional view and a perspective view illustrating another embodiment of the attachment structure of the screen member.
Figure 11:
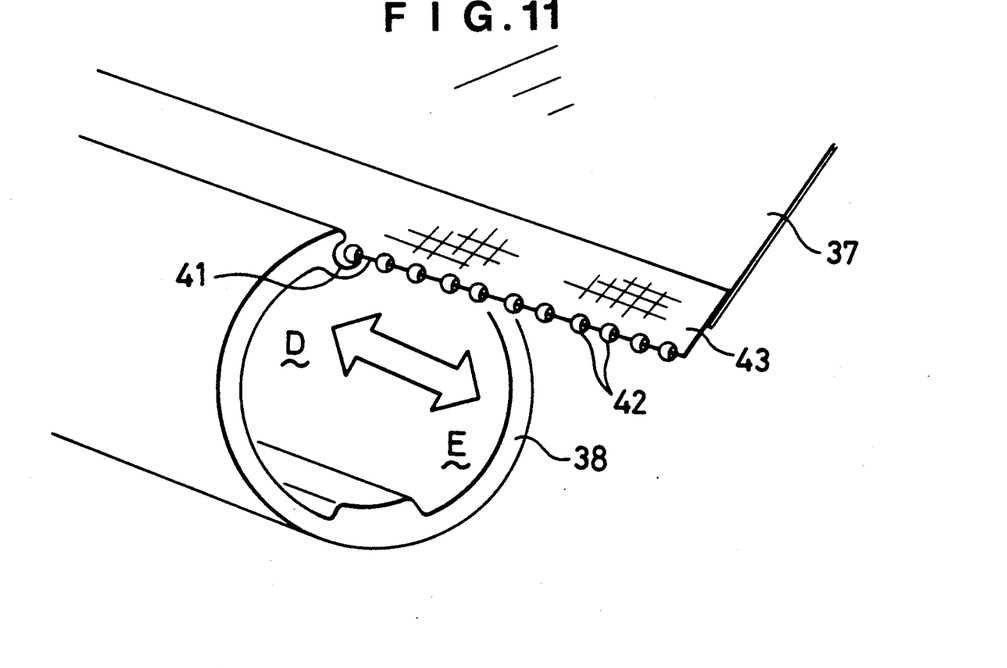

Attachment of the screen member to the roller sleeve may also be based on any of the structures illustrated in FIG. 10 and 11.

It is made possible to attach the screen member (37) to the roller sleeve (38) through insertion of a beads portion (42) provided at an end of the screen member (37) into a groove (41) provided on the roller sleeve (38) of the roller screen unit.

The screen member (37) is never inserted into the groove (41) of the roller sleeve (38), and the roller sleeve (38) is secured only at the beads portion (42). The thickness of the screen member (37), therefore, never affects the attachment.

When attaching the screen member (37) to the roller sleeve (38), as shown in FIG. 11, the beads portion (42) is inserted into the groove (41) from the end of the roller sleeve (38) in direction C. Thus, the screen member (37) can be attached to the roller sleeve (38). When removing the screen member (37), it is all to draw the beads portion (42) in direction E.

The beads portion (42) may be achieved by fixing a threadlike cord connecting beads made of such as a resin, a metal or a ceramic material to an end of a cloth (43) and connecting this cloth (43) to the screen member (37) through adhesion, fastening or sewing. More preferably, this may be achieved, for example, by weaving the cloth (43) with thermal fastening yarn as the woof and/or the warp, fixing the beads string made by connecting beads with the threadlike cord to the cloth (43) by thermally fastening to an end of the screen member (37). In addition, it is also possible to provide the beads string directly at an end of the screen member (37). Different variations are applicable as to the shape and the size of this beads string.

The attachment structure of the screen member to the roller sleeve as described above permits simple and easy attachment of the screen member to the roller sleeve, even with a single touch. A roller screen unit free from any restriction by kinds or thickness of the screen member is thus provided. Furthermore, absence of unsteadiness in the screen member after attachment enables to prevent damages at the end of the screen member.

The present invention is not limited to the embodiments presented above, but various manners are applicable in detail.

What is claimed is:

1. An automatic winding type roller screen unit, comprising:
    a roller sleeve carrying a screen member and having a hollow interior;
    a stator member having an elongated portion which extends into said hollow interior of said roller sleeve, said elongated portion of said stator member having an outer peripheral surface, engaging grooves disposed in said outer peripheral surface of said elongated portion, an actuating groove, and a first engagement projection for engagement in one rotational direction;
    a spiral spring provided in said roller sleeve for storing energy from torsional power applied to said spiral spring during drawing/expanding of the screen member, so that winding/housing of the screen member onto the roller sleeve can be accomplished by releasing said energy stored in said spiral spring;

a clutch mechanism which comprises:

a rotator member surrounding said elongated portion of said stator member, said rotator member having an inner peripheral surface and being connected for rotation with said stator member;

a plurality of recesses disposed in said inner peripheral surface of said rotator member;

a plurality of balls floatably engaging with respective ones of said recesses in said rotator member;

a ratchet member mounted about said elongated portion of said stator member such that it is rotatable about said elongated portion, said ratchet member having a main body portion and a cylindrical portion which coaxially extends within said rotator member adjacent said recesses, said cylindrical portion extending axially from an end of said main body portion of said ratchet member, said cylindrical portion having a plurality of notches which can respectively partially receive ones of said balls, said ratchet member having a plurality of second engagement portions at both ends for ratcheting engagement in one rotational direction; and a rotating member mounted about said elongated portion of said stator member, said rotating member having a third engagement portion at one end for engagement with one of said second engagement portions in a predetermined rotational direction; said rotating member having an inner and outer peripheral portions and a friction piece disposed at said outer peripheral portion of said rotating member for frictionally contacting an inner wall of said rotator member, said rotating member having a projection at said inner peripheral portion, said projection being slideably engageable with said second groove of said stator member, and a spring resiliently urging said rotating member against said ratchet member, and said rotating member being rotatable about said elongated portion of said stator member only within a limited rotational angle.

2. An automatic winding type roller screen unit comprising:

a roller sleeve carrying a screen member and having a hollow interior;

a first stator member having an elongated portion which extends into said hollow interior of said roller sleeve, said elongated portion of said first stator member having an outer peripheral surface, engaging grooves disposed in said outer peripheral surface of said elongated portion, an actuating groove, and a first engagement portion for engagement in one rotational direction;

a spiral spring provided in said roller sleeve for storing energy from torsional power applied to said spiral spring during drawing/expanding of the screen member, so that winding/housing of the screen member onto the roller sleeve can be accomplished by releasing said energy stored in said spiral spring;

a roller screen unit which comprises a clutch mechanism and a braking mechanism; said clutch mechanism comprising:

a first rotator member surrounding said elongated portion of said first stator member, said first rotator member having an inner peripheral surface and being connected for rotation with said first stator member; a plurality of recesses disposed in said inner peripheral surface of said first rotator member;

a plurality of balls floatably engaging with respective ones of said recesses in said first rotator member;

a ratchet member mounted about said elongated portion of said first stator member such that it is rotatable about said elongated portion, said ratchet member having a main body portion and a cylindrical portion which coaxially extends within said first rotator member adjacent said recesses, said cylindrical portion extending axially from an end of said main body portion of said ratchet member, said cylindrical portion having a plurality of notches which can respectively partially receive ones of said balls, said ratchet member having a plurality of second engagement portions at both ends for ratcheting engagement in one rotational direction; and a first rotating member mounted about said elongated portion of said first stator member, said first rotating member having a third engagement portion at one end for engagement with one of said second engagement portions in a predetermined rotational direction; said first rotating member having an inner and outer peripheral portions and a friction piece disposed at said outer peripheral portion of said first rotating member for frictionally contacting an inner wall of said first rotator member, said first rotating member having a projection at said inner peripheral portion, said projection being slideably engageable with said second groove of said first stator member, and a spring resiliently urging said first rotating member against said ratchet member, and said first rotating member being rotatable about said elongated portion of said first stator member only within a limited rotational angle; and said braking mechanism comprising:

a second stator member;

a second rotator member rotatably supported about said second stator member, said second rotator member having a gear portion disposed on an inner peripheral surface of said second rotator member;

a retainer and a sun gear rotatably mounted about said second stator member adjacent said retainer, both of said retainer and sun gear having a plurality of planetary pinion gears rotating with rotation of the second rotator member, connected through said gear portion provided on the inner peripheral surface of said second rotator member;

a second rotating member rotatably mounted about said second stator member, said second rotating member having a pin projecting therefrom;

a top member pivotable connected to said second rotating member by said pin, said top member having a weight balancing member, such that upon rotation of said second rotating member, said top member is urged outwardly due to centrifugal force into contact with the inner peripheral surface of said second rotator member, thereby controlling rotation of said second rotator member.

3. An automatic winding type roller screen unit comprising:
   a roller sleeve carrying a screen member and having a hollow interior;
   a first stator member having an elongated portion which extends into said hollow interior of said roller sleeve, said elongated portion of said first stator member having an outer peripheral surface, engaging grooves disposed in said outer peripheral surface of said elongated portion, an actuating groove, and a first engagement portion for engagement in one rotational direction;
   a spiral spring provided in said roller sleeve, for storing energy from torsional power applied to said spiral spring during drawing/expanding of the screen member, so that winding/housing of the screen member onto the roller sleeve can be accomplished by releasing said energy stored in said spiral spring;
   a roller screen unit which comprises a clutch mechanism, a braking mechanism and means for attaching the screen member to said roller sleeve;
   said clutch mechanism comprising:
      a first rotator member surrounding said elongated portion of said first stator member, said first rotator member having an inner peripheral surface and being connected for rotation with said first stator member; a plurality of recesses disposed in said inner peripheral surface of said first rotator member;
      a plurality of balls floatably engaging with respective ones of said recesses in said first rotator member;
      a ratchet member mounted about said elongated portion of said first stator member such that it is rotatable about said elongated portion, said ratchet member having a main body portion and a cylindrical portion which coaxially extends within said first rotator member adjacent said recesses, said cylindrical portion extending axially from an end of said main body portion of said ratchet member, said cylindrical portion having a plurality of notches which can respectively partially receive ones of said balls, said ratchet member having a plurality of second engagement portions at both ends for ratcheting engagement in one rotational direction; and
      a first rotating member mounted about said elongated portion of said first stator member, said first rotating member having a third engagement portion at one end for engagement with one of said second engagement portions in a predetermined rotational direction; said first rotating member having an inner and outer peripheral portions and a friction piece disposed at said outer peripheral portion of said first rotating member for frictionally contacting an inner wall of said first rotator member, said first rotating member having a projection at said inner peripheral portion, said projection being slideably engageable with said second groove of said first stator member, and a spring resiliently urging said first rotating member against said ratchet member, and said first rotating member being rotatable about said elongated portion of said first stator member only within a limited rotational angle; said braking mechanism comprising:
   a second stator member;
   a second rotator member rotatably supported about said second stator member, said second rotator member having a gear portion disposed on an inner peripheral surface of said second rotator member;
   a retainer and a sun gear rotatably mounted about said second stator member adjacent said retainer, both of said retainer and sun gear having a plurality of planetary pinion gears rotating with rotation of the second rotator member, connected through said gear portion provided on the inner peripheral surface of said second rotator member;
   a second rotating member rotatably mounted about said second stator member, said second rotating member having a pin projecting therefrom;
   a top member pivotable connected to said second rotating member by said pin, said top member having a weight balancing member, such that upon rotation of said second rotating member, said top member is urged outwardly due to centrifugal force into contact with the inner peripheral surface of said second rotator member, thereby controlling rotation of said second rotator member; and said attachment means for attaching the screen member to said roller sleeve comprising a connecting portion disposed at an end of said screen member which is engaged with a connecting groove disposed in said roller sleeve oriented in a longitudinal direction of said roller sleeve.

4. An automatic winding type roller screen unit as claimed in claim 2 or 3, further comprising a stop mechanism having a boss member, for stopping rotation of said second rotator member, in contact with the fixed portion of said second stator member, after horizontal movement while rotating with rotation of said second rotator member, said stop mechanism being connected to said braking mechanism.

5. An automatic winding type roller screen unit comprising:
   a roller sleeve carrying a screen member and having a hollow interior;
   a first stator member having an elongated portion which extends into said hollow interior of said roller sleeve, said elongated portion of said stator member having an outer peripheral surface, engaging grooves disposed in said outer peripheral surface of said elongated portion, an actuating groove, and an engagement portion for engagement in one rotational direction;
   a spiral spring provided in said roller sleeve for storing energy from torsional power applied to said spiral spring during drawing/expanding of the screen member, so that winding/housing of the screen member onto the roller sleeve can be accomplished by releasing said energy stored in said spiral spring; a roller screen unit which comprises a braking mechanism; said braking mechanism comprising:
   a second stator member;
   a rotator member rotatably supported about said stator member, said rotator member having a gear portion disposed on an inner peripheral surface of said rotator member;

a retainer and a sun gear rotatably mounted about said stator member adjacent said retainer, both of said retainer and sun gear having a plurality of planetary pinion gears rotating with rotation of the rotator member, connected through said gear portion provided on the inner peripheral surface of said rotator member;

a rotating member rotatably mounted about said stator member, said rotating member having a pin projecting therefrom;

a top member pivotable connected to said rotating member by said pin, said top member having a weight balancing member, such that upon rotation of said rotating member, said top member is urged outwardly due to centrifugal force into contact with the inner peripheral surface of said rotator member, thereby controlling rotation of said rotator member.

6. An automatic winding type roller screen unit as claimed in claim 5, further comprising a stop mechanism having a boss member, for stopping rotation of said rotator member, in contact with the fixed portion of said stator member, after horizontal movement while rotating with rotation of said rotator member, said stop mechanism being connected to said braking mechanism.

7. An automatic winding type roller screen unit, comprising:

a roller sleeve carrying a screen member and having a hollow interior;

a stator member having an elongated portion which extends into said hollow interior of said roller sleeve, said elongated portion of said stator member having an outer peripheral surface, engaging grooves disposed in said outer peripheral surface of said elongated portion, an actuating groove, and an engagement portion for engagement in one rotational direction;

a spiral spring provided in said roller sleeve for storing energy from torsional power applied to said spiral spring during drawing/expanding of the screen member, so that winding/housing of the screen member onto the roller sleeve can be accomplished by releasing said energy stored in said spiral spring;

a roller screen unit having an attachment structure for attachment of the screen member to said roller sleeve, comprising a connecting portion disposed at an end of the screen member for engagement with a connecting groove disposed in said roller sleeve oriented in a longitudinal direction of said roller sleeve.

8. An automatic winding type roller screen unit as claimed in claim 3 or 7, which comprises: a notch and a groove disposed in said roller sleeve oriented in a longitudinal direction of said roller sleeve;

a hard sheet member having a projection secured at an end of the screen member and having side edge turnups; and an attachment structure for attachment of the screen member to said roller sleeve in which the screen member is attached to said roller sleeve through insertion of the leading ends of one of said side edge turnups and said hard sheet member into said notch and engagement of said projection with said groove.

9. An automatic winding type roller screen unit as claimed in claim 8, wherein one of said side edge turnups of said hard sheet member securing the screen member is made of a relatively soft material.

10. An automatic winding type roller screen unit as claimed in claim 3 or 7, having an attachment structure for attaching the screen member to said roller sleeve, said attachment structure comprising a beads portion disposed at an end of the screen member and which is inserted into said connecting groove which is oriented in the longitudinal direction of said roller sleeve.

11. An automatic winding type roller screen unit as claimed in claim 10, wherein said beads portion comprises a beads string composed of beads connected by a threadlike cord, and said attachment structure further comprises a beads connecting cloth which is composed of a cloth woven with thermal fastening yarn, and wherein said attachment structure is thermally fastened to an end of the screen member.

* * * * *

UNITED STATES PATENT AND TRADEMARK OFFICE
CERTIFICATE OF CORRECTION

PATENT NO. : 5,099,906

DATED : March 31, 1992

INVENTOR(S) : CHIGUSA et al

It is certified that error appears in the above-identified patent and that said Letters Patent is hereby corrected as shown below:

Col. 8, claim 1, line 65, "projection" should read --portion--.

Col. 11, claim 3, line 17, delete ",".

Col. 12, claim 5, line 68, insert --second-- in front of "stator".

Col. 13, claim 5, line 11, insert --second-- in front of "stator".

Col. 13, claim 6, line 24, after "said" insert --second--.

Signed and Sealed this

Twenty-fourth Day of August, 1993

Attest:

Attesting Officer

BRUCE LEHMAN

Commissioner of Patents and Trademarks